United States Patent
Mathew et al.

(10) Patent No.: US 7,585,735 B2
(45) Date of Patent: Sep. 8, 2009

(54) ASYMMETRIC SPACERS AND ASYMMETRIC SOURCE/DRAIN EXTENSION LAYERS

(75) Inventors: Leo Mathew, Austin, TX (US); Yang Du, Austin, TX (US); Bich-Yen Nguyen, Austin, TX (US); Voon-Yew Thean, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 388 days.

(21) Appl. No.: 11/047,946

(22) Filed: Feb. 1, 2005

(65) Prior Publication Data
US 2006/0170016 A1 Aug. 3, 2006

(51) Int. Cl.
*H01L 21/8234* (2006.01)
(52) U.S. Cl. .............. 438/286; 257/288; 257/E21.619; 257/E21.634
(58) Field of Classification Search .................. 257/408
See application file for complete search history.

(56) References Cited

U.S. PATENT DOCUMENTS

| | | | | |
|---|---|---|---|---|
| 5,656,518 A | * | 8/1997 | Gardner et al. | 438/286 |
| 5,952,702 A | * | 9/1999 | Gardner et al. | 257/408 |
| 6,004,849 A | * | 12/1999 | Gardner et al. | 438/286 |
| 6,150,266 A | * | 11/2000 | Lin et al. | 438/682 |
| 6,200,864 B1 | * | 3/2001 | Selcuk | 438/286 |
| 6,246,091 B1 | * | 6/2001 | Rodder | 257/335 |
| 6,255,219 B1 | * | 7/2001 | Xiang et al. | 438/705 |
| 6,344,396 B1 | * | 2/2002 | Ishida et al. | 438/286 |
| 6,746,924 B1 | | 6/2004 | Lee et al. | 438/286 |
| 6,887,762 B1 | * | 5/2005 | Murthy et al. | 438/300 |
| 7,183,662 B2 | * | 2/2007 | Kim et al. | 257/314 |
| 2004/0075151 A1 | | 4/2004 | Fung et al. | 257/391 |
| 2004/0217392 A1 | * | 11/2004 | Mathew et al. | 257/288 |
| 2006/0121711 A1 | * | 6/2006 | Kelling et al. | 438/585 |
| 2008/0142838 A1 | * | 6/2008 | Ohta et al. | 257/190 |

OTHER PUBLICATIONS

Chidambaram, et al.. "35% Drive Current Improvement From Recessed SiGe Drain Extensions on 37 nm Gate Length PMOS." 2004 Symposium on VLSI Technology, Digest of Technical Papers, pp. 48-49.*

* cited by examiner

*Primary Examiner*—Sue Purvis
*Assistant Examiner*—Benjamin P Sandvik
(74) *Attorney, Agent, or Firm*—John A. Fortkort; Fortkort & Houston P.C.

(57) ABSTRACT

A method of forming a semiconductor device is provided in which a substrate (102) is provided which has a gate dielectric layer (106) disposed thereon, and a gate electrode (116) having first and second sidewalls is formed over the gate dielectric layer. First (146) and second (150) extension spacer structures are formed adjacent the first and second sidewalls, respectively. In the resulting device: (a) the first and second extension spacer structures have different dimensions; (b) the first and second extension spacer structures comprise first and second distinct materials; (c) the device has asymmetric source/drain extensions (162); and/or (d) the device has an oxide layer (160) disposed between the first extension spacer structure and the gate electrode, and either (i) the device has no dielectric layer disposed between the second extension spacer structure and the gate electrode, or (ii) the device has a second dielectric layer disposed between the second extension spacer structure and the gate electrode, and the first dielectric layer is substantially thicker than the second dielectric layer.

18 Claims, 5 Drawing Sheets

ASYMMETRIC SPACERS AND ASYMMETRIC SOURCE/DRAIN EXTENSION LAYERS

FIELD OF THE DISCLOSURE

The present disclosure relates generally to the fabrication of semiconductor devices, and relates more particularly to methods for forming transistors having asymmetric extension spacers or asymmetric source/drain extension layers.

BACKGROUND

Ideally, transistors should exhibit both high performance and low power consumption. Typically, however, the design and fabrication of transistors has required a tradeoff between these two parameters. In particular, in conventional processes, optimizing one of these parameters tends to adversely affect the other. For example, as transistor channel lengths are decreased to improve the speed of a device, thereby optimizing device performance, other characteristics, such as sub-threshold leakage, tend to become more difficult to control, thereby increasing the power consumption of the device.

There is thus a need in the art for a transistor, and a method for making the same, which overcomes this infirmity. In particular, there is a need in the art for a transistor, and a method for making the same, in which aspects of the device which affect performance characteristics can be optimized independently of those aspects which minimize power consumption. These and other needs are met by the devices and methodologies described herein.

SUMMARY

In one aspect, a method of forming a semiconductor device, such as a transistor, is provided. In accordance with the method, a substrate is provided which has a gate dielectric layer disposed thereon. A gate electrode is formed over the gate dielectric layer, the gate electrode having first and second sidewalls. First and second extension spacer structures are formed adjacent the first and second sidewalls, respectively. The semiconductor device has at least one characteristic selected from the group consisting of: (a) the first and second extension spacer structures have different dimensions; (b) the first and second extension spacer structures comprise first and second distinct materials; (c) the device has source/drain extensions that are asymmetrically disposed about the gate electrode; and (d) the device has a first dielectric layer disposed between the first extension spacer structure and the gate electrode, and either (i) the device has no dielectric layer disposed between the second extension spacer structure and the gate electrode, or (ii) the device has a second dielectric layer disposed between the second extension spacer structure and the gate electrode, and the first dielectric layer is substantially thicker than the second dielectric layer.

In another aspect, a semiconductor device, such as a transistor, is provided. The semiconductor device comprises (a) a substrate having a gate dielectric layer disposed thereon, (b) a gate electrode disposed over the gate dielectric layer, the gate electrode having first and second sidewalls, and (c) first and second extension spacer structures adjacent said first and second sidewalls, respectively; wherein the semiconductor device has at least one characteristic selected from the group consisting of: (a) the first and second extension spacer structures have different dimensions; (b) the first and second extension spacer structures comprise first and second distinct materials; (c) the device has source/drain extensions that are asymmetrically disposed about the gate electrode; and (d) the device has a first dielectric layer disposed between the first extension spacer structure and the gate electrode, and either (i) the device has no dielectric layer disposed between the second extension spacer structure and the gate electrode, or (ii) the device has a second dielectric layer disposed between the second extension spacer structure and the gate electrode, and the first dielectric layer is substantially thicker than the second dielectric layer. These and other aspects of the present disclosure are described in greater detail below.

DETAILED DESCRIPTION

Figure 1:
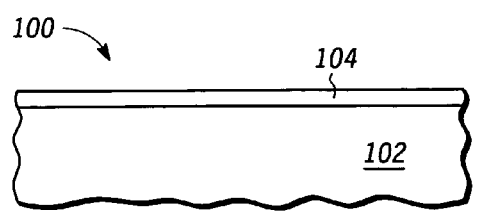
FIG. 1 is a partial cross-sectional view of a semiconductor wafer in which a gate dielectric is formed over a semiconductor substrate.

It has now been found that the aforementioned needs may be met by forming a transistor or other semiconductor device by providing a substrate having a gate dielectric layer disposed thereon; forming a gate electrode over the gate dielectric layer, the gate electrode having first and second sidewalls; and forming first and second extension spacers adjacent to the first and second sidewalls, respectively. In some embodiments, various other steps may be performed, such as the formation of source/drain regions and/or source/drain extension, and the formation of dielectric layers between one or both of the first and second extension spacers. These steps are conducted such that the semiconductor device has at least one characteristic selected from the group consisting of: (a) the first and second spacers have different dimensions; (b) the first and second spacers comprise first and second distinct materials; (c) the device has source/drain extensions that are asymmetrically disposed about the gate electrode; and (d) the device has a first dielectric layer disposed between the first spacer and the gate electrode, and either (i) the device has no dielectric layer disposed between the second spacer and the gate electrode, or (ii) the device has a second dielectric layer disposed between the second spacer and the gate electrode, and the first dielectric layer is substantially thicker than the second dielectric layer.

The methodology described herein permits the formation of asymmetric spacers and/or asymmetric source/drain layers that have a variety of useful properties, and also permits the spacers and/or source/drain layers to be formed and defined independently of each other, to be formed out of different materials, and to be created with different dimensions.

For example, this approach permits the formation of a thicker oxide layer at the drain side of a transistor (which reduces leakage) without a corresponding increase in the thickness of the oxide layer (and associated reduction in gate capacitance) at the source side of the transistor, where the oxide layer is preferably as thin as possible. This approach also permits the formation of structures in which the first and second spacers comprise diverse materials (e.g., one spacer comprises oxide and the other spacer comprises nitride); such structures provide nonlinear stress in the channel, and hence provide more options in tuning the stress across the channel in a complimentary manner between NMOS and PMOS regions of CMOS devices. Moreover, the use of asymmetric portions of SiGe in the extension regions provides more options in choosing between NMOS/PMOS and $I_{on}/I_{off}$ trade off; thus, for example, complimentary NMOS/PMOS devices can trade off $I_{on}/I_{off}$ depending on which side is wired as the source or drain.

Generally speaking, the teachings herein contemplate the formation of a transistor that employs (preferably dielectric) extension spacer structures on the sidewalls of the transistor gate electrode. Specific embodiments of the processes that may be used to form these structures are disclosed herein, it being understood that many variations in these processes are possible without departing from the scope of the present teachings.

Referring now to FIG. 1, a gate dielectric film 104 is formed over a semiconductor substrate 102 of a semiconductor wafer 100. In one embodiment, gate dielectric 104 is a silicon dioxide film formed by the thermal oxidation of the upper surface of semiconductor substrate 102. Thermal oxidation of substrate 102 may be achieved, for example, by exposing the wafer to an oxidizing atmosphere (e.g., $O_2$, $H_2O$, or the like) at a temperature in excess of 900° C.

Typically, gate dielectric 104 has a thickness of anywhere from about 15 to about 150 angstroms. In some embodiments, the gate dielectric 104 may be a "high K" dielectric having a dielectric constant K which is greater than 4.0. High K dielectrics are desirable for use in gate dielectric films to achieve sufficient capacitance with a thicker film. High K materials suitable for use as the gate dielectric 104 include various metal-oxide compounds such as hafnium-oxide, as well as other materials including aluminum oxide, hafnium silicate, zirconium silicate, hafnium aluminate, lanthanum aluminate, zirconium aluminate, and lanthanum oxide.

The upper portion of semiconductor substrate 102 typically includes a monocrystalline semiconductor material such as silicon on which the gate dielectric 104 is formed. In one embodiment that is particularly suitable for use with low power applications such as mobile and wireless devices, semiconductor substrate 102 is a silicon-on-insulator (SOI) substrate in which the monocrystalline silicon is a relatively thin film (i.e., less than 10,000 angstroms) formed over a buried oxide with a thickness roughly in the range of 1000 to 20,000 angstroms.

Figure 2:
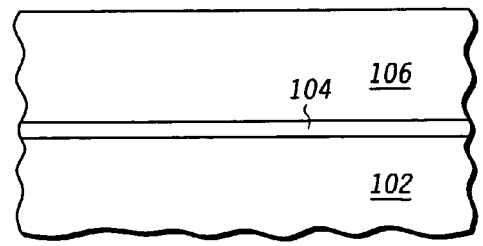
FIG. 2 illustrates processing subsequent to FIG. 1 in which a gate electrode film is formed over the gate dielectric.

Referring now to FIG. 2, a gate electrode film 106 is formed over the gate dielectric 104. Preferably, gate electrode film 106 is a polysilicon film which may be formed by the thermal decomposition of silane in a reactor chamber maintained at a temperature in the range of approximately 550-650° C. When the gate electrode film 106 is polysilicon, the polysilicon film is typically deposited as undoped silicon and is subsequently doped with an n-type (e.g., phosphorous, arsenic) or p-type (e.g., boron) dopant using ion implantation. The polysilicon may be doped in-situ or by diffusion. In some embodiments, the gate electrode film 106 may also comprise such materials as germanium, tantalum silicon nitride, titanium nitride, molybdenum nitride or a combination thereof, either in addition to or in lieu of polysilicon.

Figure 3:
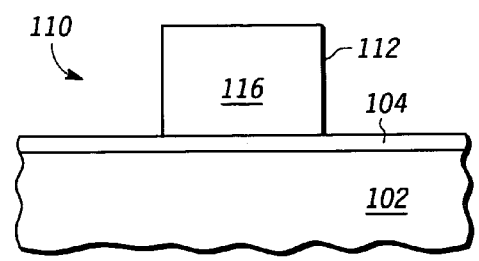
FIG. 3 illustrates processing subsequent to FIG. 2 in which the gate electrode film is patterned to form a gate electrode structure.

Referring now to FIG. 3, gate electrode film 106 (see FIG. 2) is patterned to form a gate electrode 116 having substantially vertical sidewalls 112. Gate electrode 116 is typically patterned using photolithography and anisotropic or dry etch techniques that are well known in the art. The photolithography may include the use of an anti-reflective coating (ARC) and photoresist patterning techniques.

Figure 4:
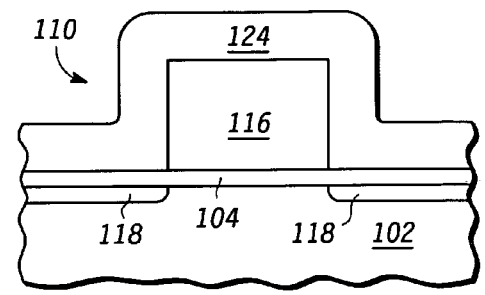
FIG. 4 illustrates processing subsequent to FIG. 3 in which a first dielectric is formed over the substrate and the gate electrode.

Referring now to FIG. 4, one or more implant steps may be performed after forming gate electrode 116. In some embodiments, one or more implants are formed to introduce source/drain extension regions 118 into those portions of substrate 102 not covered by gate electrode 116. The source/drain extension regions 118 are desirable to control the threshold voltage and effective channel-length of the resulting device. In embodiments in which the substrate 102 is an SOI wafer, however, high dose ion implantation is undesirable because it is difficult to maintain the dose adequately within the very shallow silicon substrate.

Referring again to FIG. 4, a first dielectric extension spacer film 124 is formed over gate electrode 116. In some embodiments, the first extension spacer film 124 may be a low-K dielectric having a dielectric constant K of less than approximately 4.0. In other embodiments, the first extension spacer film 124 includes a film of chemically vapor deposited (CVD) silicon nitride. In such later embodiments, the CVD silicon nitride may be formed by the reaction of dichlorosilane or silane with ammonia in a reactor maintained at a temperature within the range of 300-800° C. A CVD silicon oxide pad layer may be deposited over gate electrode 116 prior to depositing the silicon nitride so as to alleviate the stress that often occurs when silicon nitride contacts silicon. The first extension spacer film 124 is deposited in a substantially conformal manner such that the film thickness in vertical portions of the topography is roughly within at least 80% of the film thickness in horizontal portions of the topography.

Figure 5:
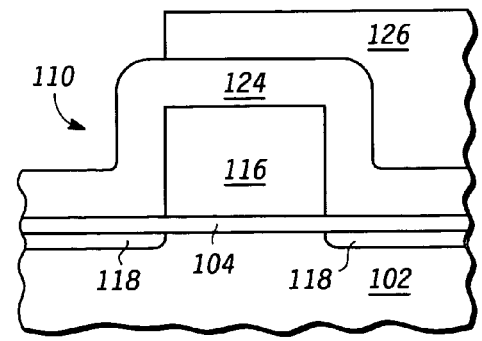
FIG. 5 illustrates processing subsequent to FIG. 4 in which a photoresist mask is formed over the first dielectric layer.
Figure 6:
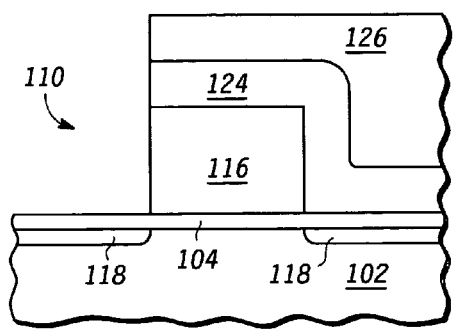
FIG. 6 illustrates processing subsequent to FIG. 5 in which a portion of the first dielectric film is removed.
Figure 7:
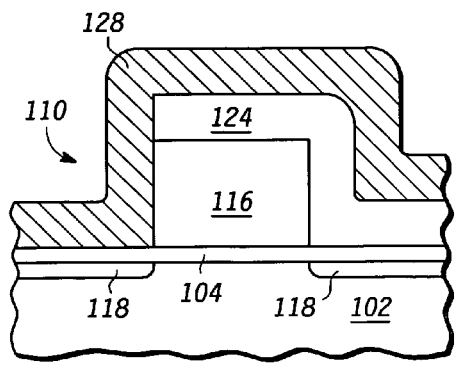
FIG. 7 illustrates processing subsequent to FIG. 6 in which the photoresist is removed and a second dielectric film is formed on the exposed portion of the substrate.
Figure 8:
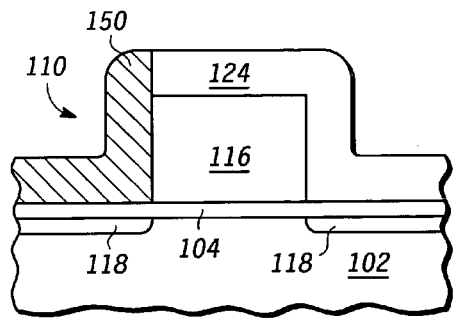
FIG. 8 illustrates processing subsequent to FIG. 7 in which a first sidewall spacer is formed.
Figure 9:
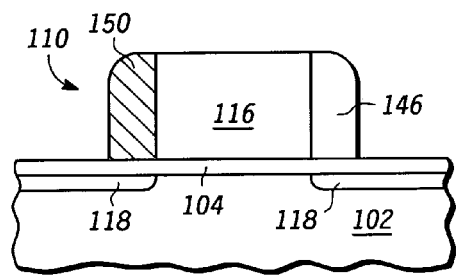
FIG. 9 illustrates processing subsequent to FIG. 8 in which the first and second dielectric films are etched to form the dielectric spacers.

As shown in FIG. 5, a layer of photoresist 126 is then deposited over first extension spacer film 124 such that a portion of the first extension spacer film 124 on one side of the gate electrode 116 is left exposed. As shown in FIG. 6, the exposed portion of the first extension spacer film 124 is subsequently removed using a suitable etching technique, and the photoresist is then stripped, after which a second extension spacer film 128 is deposited over the exposed portion of the structure as shown in FIG. 7. Then, as shown in FIG. 8, the second extension spacer film 128 is anisotropically etched to remove a portion thereof. Referring to FIG. 9, a portion of the first and second extension spacer films 124 and 128 are then anisotropically etched to produce first and second extension spacer structures 146 and 150, respectively. The etch rates can be adjusted as necessary to ensure that the extension spacers structures 146 and 150 remain on both sides of the gate electrode 116.

Preferably, the lateral thickness of extension spacer structures 146 and 150 is approximately ¼ to ½ the lateral dimension (L) of gate electrode 116. If, for example, L is approximately 100 nm, then the lateral thickness of extension spacer structures 146 and 150 will typically be within the range of about 25 to about 50 nm, together or individually. In other embodiments, however, the lateral dimensions of extension spacer structures 146 and 150 may be outside of this range. Extension spacer structures 146 and 150 may include CVD silicon oxide, silicon nitride, or a combination of the two. The extension spacer structures 146 and 150 act to prevent shorting between source/drain regions and the gate electrode of the resulting transistor.

Figure 10:
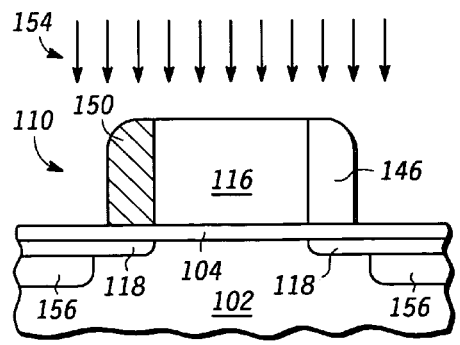
FIG. 10 illustrates processing subsequent to FIG. 9 in which source/drain regions of the substrate are implanted using the gate electrode, the extensions, and the dielectrics as an implant mask.

Referring now to FIG. 10, a source/drain implant 154 is then performed to introduce source/drain regions 156 in the form of impurity distributions in the substrate 102. The source/drain regions 156 are formed using gate electrode 116 and extension spacer structures 146 and 150 as implant masks such that the source/drain regions 156 that result are effectively self-aligned to extension spacer structures 146 and 150. In an n-channel transistor embodiment, the source/drain implant 154 typically uses an n-type species such as phosphorous or arsenic, while in a p-channel transistor embodiment, the source/drain implant 154 typically uses boron or another p-type dopant. The impurity distribution in the source/drain region 156 is preferably in excess of roughly $10^{19}$ atoms/cm$^3$.

Figure 11:
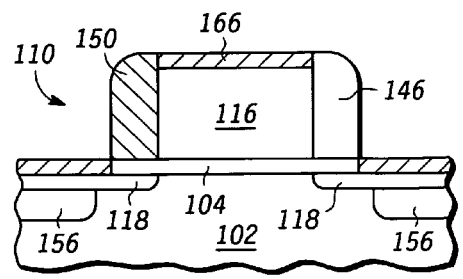
FIG. 11 illustrates processing subsequent to FIG. 10 in which a metal film is deposited over the wafer and in which silicide regions are formed.

Referring now to FIG. 11, the source and drain regions 156 and the gate electrode 116 are subjected to silicidation. In particular, a metal 166 such as cobalt is uniformly deposited over wafer 100. Prior to this deposition, any dielectric materials over the source/drain regions 156, including the portion of gate dielectric 104, and any residual dielectric materials on the upper surface of gate electrode 116, are removed to expose the doped semiconductor within substrate 102 and the polysilicon or other material of gate electrode 116. To the extent that the dielectrics to be removed include silicon oxide, an HF dip or other suitable wet or dry process may be used for this purpose, while silicon nitride and other dielectrics may require conventional dry etch processing for their removal.

Figure 12:
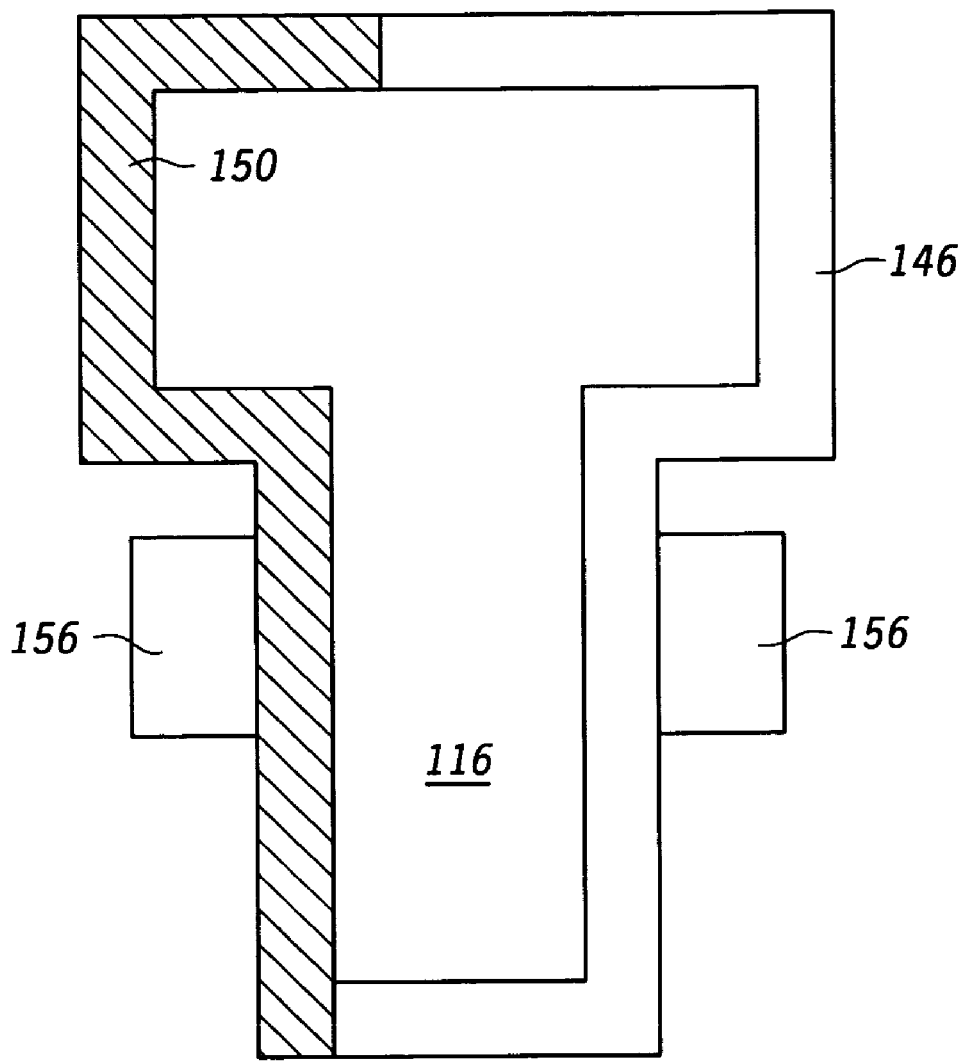
FIG. 12 is a top view of a transistor made by the process depicted in FIGS. 1-11.
Figure 13:
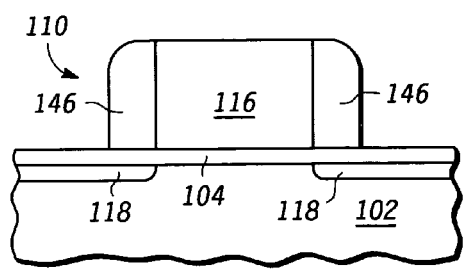
FIG. 13 illustrates processing subsequent to FIG. 4 in which the first dielectric layer has been etched to form dielectric spacers.

After metal 166 is deposited, wafer 100 and metal 166 are exposed to a heated atmosphere to form silicide wherever the metal 166 contacts silicon (or contacts other semiconductor materials). The portions of metal 166 in contact with a dielectric, including those in contact with spacer extension structures 146 and 150, remain unreacted after the heat step, thereby enabling the unreacted portions to be selectively removed as shown in FIG. 11. A top view of the resulting structure is shown in FIG. 12. As shown in FIG. 12, the source and drain of the transistor can be assigned on either side of the first or second extension spacer structures 146 and 150, respectively. Metal 166 may include other metals in addition to or in lieu of cobalt, such as nickel, titanium, titanium nitride, and combinations thereof.

Figure 14:
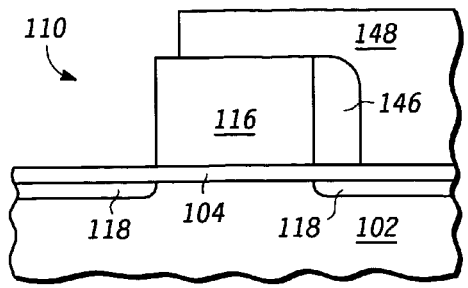
FIG. 14 illustrates processing subsequent to FIG. 13 in which a photoresist mask has been deposited over the structure, followed by etching to remove one of the spacer structures.
Figure 15:
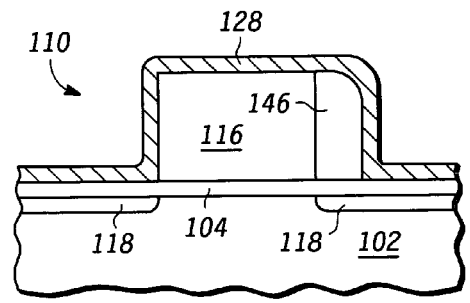
FIG. 15 illustrates processing subsequent to FIG. 14 in which the photoresist mask has been stripped, followed by deposition of a second dielectric layer that is thinner and of a different material than the first dielectric layer.
Figure 16:
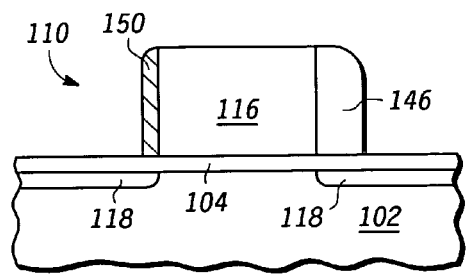
FIG. 16 illustrates processing subsequent to FIG. 15 in which the first and second dielectric layer has been etched to form first and second dielectric spacers.

FIGS. 13-16 depict another possible embodiment of the methodology described herein. Starting with the structure depicted in FIG. 4, anisotropic etching is utilized to remove portions of first extension spacer film 124, thus forming the structure depicted in FIG. 13 wherein extension spacer structures 146 are formed on either side of the gate electrode 116. A photoresist mask 148 is then utilized to remove the extension spacer structure on one side of the gate electrode 116, as depicted in FIG. 14. The photoresist mask 148 is then stripped, and a second extension spacer film 128 comprising a second dielectric material is deposited over the structure, as shown in FIG. 15. In this case, extension spacer film 128 is depicted as being thinner than first extension spacer film 124 (see FIG. 4). The resulting structure is then subjected to an anisotropic etch, thus yielding the structure depicted in FIG. 16 in which extension spacers 146 and 150 are formed which comprise diverse materials and have different dimensions. Hence, the structure depicted in FIG. 16 contains two anisotropic features (the diverse composition and dimensions of the extension spacer structures).

Figure 17:
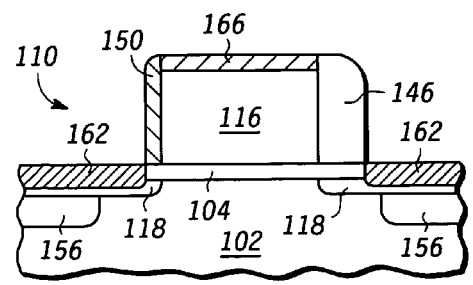
FIG. 17 illustrates processing subsequent to FIG. 16 in which a selective epitaxy is used to grow extension layers in exposed regions of the device.

Source/drain regions 156 are then implanted as shown in FIG. 17, followed by a metal silicidation process of the type previously described that is used to define metal silicide portions 166 over the gate electrode 116 and the source/drain regions 156. As shown in FIG. 17, this method results in the formation on one side of the structure of a layer of SiGe 162 which is disposed between the extension spacer structure 150 and the source/drain extension region 118. Assuming that the layer of semiconductor material 162 is disposed on the source side, such a structure increases injection efficiency without degrading leakage current, because the gate/drain interface is devoid of the semiconductor material. It will be appreciated that, while SiGe is the preferred material, SiGeC or other suitable semiconductor materials could also be used.

The structures depicted in FIGS. 11 and 17 are particularly desirable, because they allow the materials for the extension spacer structures to be selected for the source and drain regions independently of each other. The structures of FIGS. 11 and 17 can be used to provide nonlinear stress in the channel, and hence allow more options in tuning the stress across the channel in a complimentary manner between the NMOS and PMOS regions. Moreover, this approach allows the extension spacer structures to be formed with different dimensions (e.g., the extension spacer structure on the source side can be made wider than the extension spacer structure on the drain side, or vice versa). Since the width of the extension spacer structures determines the distance between the gate electrode and the source and drain regions, this capability can be used to modify the electrical characteristics of the transistor.

Figure 18:
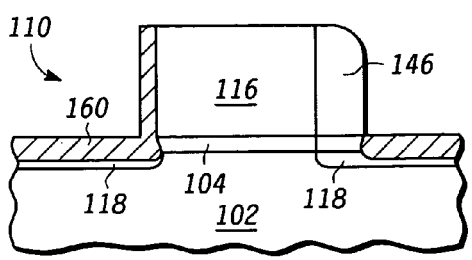
FIG. 18 illustrates processing subsequent to FIG. 14 in which the photoresist mask is stripped, followed by oxidation of the exposed surfaces.
Figure 19:
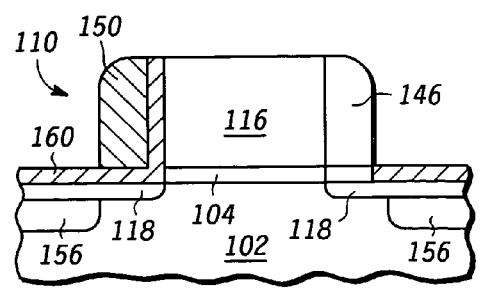
FIG. 19 illustrates processing subsequent to FIG. 18 in which a second dielectric film is deposited over the wafer, and a second spacer is formed.

With reference to FIGS. 18 and 19, a further embodiment of the methodology disclosed herein is illustrated. Starting with a structure similar to that depicted in FIG. 14 (but in which the mask is disposed only over the top of the gate electrode 116), the exposed portions of the substrate and the exposed side of the gate electrode 116 are subjected to thermal oxidation to define a layer of oxide 160 on these surfaces. The thermal oxidation may be accomplished using, for example, an atmosphere comprising a mixture of nitrogen with $O_2$ or $H_2O$. Using the methodologies previously described, a second extension spacer structure 150 is then defined over the oxide layer 160. This second extension spacer structure 150 may comprise the same or different materials as the first extension spacer structure 146.

Figure 20:
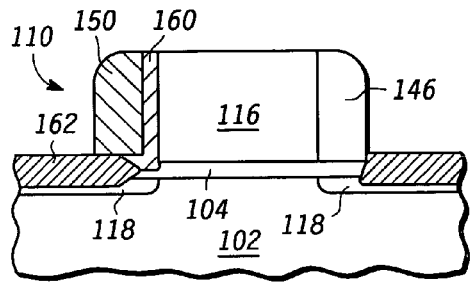
FIG. 20 illustrates processing subsequent to FIG. 14 in which silicon regions in the source and drain regions are exposed and SiGe is epitaxially grown on the exposed surfaces.
Figure 21:
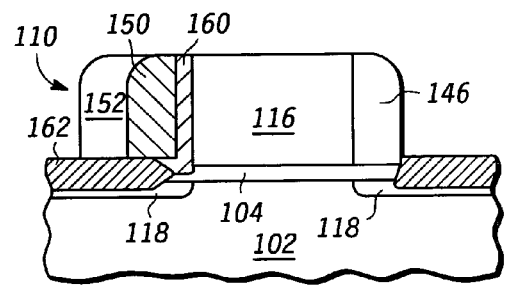
FIG. 21 illustrates processing subsequent to FIG. 20 in which a third spacer structure is formed by deposition of a second dielectric layer, followed by etching (this figure illustrates three asymmetries, including asymmetric spacers, asymmetric source/drain layers under spacers, and asymmetric re-oxidized layers).

Referring now to FIG. 20, a further embodiment of the methodology disclosed herein is illustrated. In this case, all three of the aforementioned asymmetric properties are combined into a single structure. Starting with the structure depicted in FIG. 19, the exposed portions of the substrate are subjected to epitaxial growth using SiGe, thus resulting in the formation of a source/drain extension layer 162 thereon. Using the methodologies previously described, a third extension spacer structure 152 is then defined over the source/drain extension layer 162 as shown in FIG. 21. This third extension spacer structure 152 may comprise the same or different materials as the first extension spacer structure 146 and the second extension spacer structure 150.

This approach can be utilized to form structures with particularly desirable properties. In particular, if the extension spacer structure 146 is positioned on the source side, this approach can be used for the selective formation of a thicker layer of oxide 160 on the drain side than on the source side. Such an approach permits the electrical properties of the transistor to be tuned as desired. For example, this approach can be utilized to reduce capacitance and leakage current of the transistor on the drain side, without adversely effecting the source side. This approach is possible since the drain side is where the transistor is biased with a higher potential, and hence is prone to higher electric fields which induce leakage. This approach also improves the reliability of the transistor structure.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A semiconductor device, comprising:
a substrate having a gate dielectric layer disposed thereon;
a gate electrode disposed over the gate dielectric layer, said gate electrode having first and second sidewalls; and
first and second extension spacer structures disposed adjacent to said first and second sidewalls, respectively; and
source and drain regions and a layer of semiconductor material selected from the group consisting of SiGe and SiGeC, said layer being disposed between said first extension spacer structure and said source region, wherein the layer of semiconductor material is not disposed between the second extension spacer structure and the drain;
wherein the semiconductor device has at least one characteristic selected from the group consisting of: (a) the first and second extension spacer structures comprise first and second distinct materials; (b) the device has source/drain extensions that are asymmetrically disposed about the gate electrode; and (c) the device has a first dielectric layer disposed between the first extension spacer structure and the gate electrode, and either (i) the device has no dielectric layer disposed between the second extension spacer structure and the gate electrode, or (ii) the device has a second dielectric layer disposed between the second extension spacer structure and the gate electrode, and the first dielectric layer is substantially thicker than the second dielectric layer.

2. The device of claim 1, wherein the device has a first dielectric layer disposed between the first extension spacer structure and the gate electrode, and the device has no dielectric layer disposed between the second extension spacer structure and the gate electrode.

3. The device of claim 1, wherein the device has a first dielectric layer disposed between the first extension spacer structure and the gate electrode, wherein the device has a second dielectric layer disposed between the second extension spacer structure and the gate electrode, and wherein the first dielectric layer is substantially thicker than the second dielectric layer.

4. The device of claim 1, wherein the first and second extension spacer structures comprise first and second distinct materials.

5. The device of claim 1, wherein the device has source/drain extensions that are asymmetrically disposed about the gate electrode, and wherein the source/drain extensions comprise a material selected from the group consisting of SiGe and SiGeC.

6. The device of claim 1, further comprising source/drain regions disposed in the substrate adjacent to the first and second extension spacer structures, and wherein the source/drain regions are aligned with the first and second extension spacer structures.

7. A method for forming a semiconductor device, comprising:
providing a substrate having a gate dielectric layer disposed thereon;
forming a gate electrode over the gate dielectric layer, the gate electrode having first and second sidewalls; and
forming first and second extension spacer structures adjacent to the first and second sidewalls, respectively; and
forming source and drain regions and a layer of semiconductor material selected from the group consisting of SiGe and SiGeC, said layer being disposed between said first extension spacer structure and said source region, wherein the layer of semiconductor material is not disposed between the second extension spacer structure and the drain;
wherein the semiconductor device has at least one characteristic selected from the group consisting of: (a) the first and second extension spacer structures comprise first and second distinct materials; (b) the device has source/drain extensions that are asymmetrically disposed about the gate electrode; and (c) the device has a first dielectric layer disposed between the first extension spacer structure and the gate electrode, and either (i) the device has no dielectric layer disposed between the second extension spacer structure and the gate electrode, or (ii) the device has a second dielectric layer disposed between the second extension spacer structure and the gate electrode, and the first dielectric layer is substantially thicker than the second dielectric layer.

8. The method of claim 7, wherein the device has a first dielectric layer disposed between the first extension spacer structure and the gate electrode, and the device has no dielectric layer disposed between the second extension spacer structure and the gate electrode.

9. The method of claim 7, wherein the device has a first dielectric layer disposed between the first extension spacer structure and the gate electrode, wherein the device has a second dielectric layer disposed between the second extension spacer structure and the gate electrode, and wherein the first dielectric layer is substantially thicker than the second dielectric layer.

10. The method of claim 7, wherein the first and second extension spacer structures comprise first and second distinct materials.

11. The method of claim 7, the device has source/drain extensions that are asymmetrically disposed about the gate electrode, and wherein the asymmetrically grown source/drain extensions comprise a material selected from the group consisting of SiGe and SiGeC.

12. The method of claim 7, wherein the
source/drain regions are disposed in the substrate adjacent to the first and second extension spacer structures such that the source/drain regions are aligned with the first and second extension spacer structures.

13. The method of claim 7, further comprising forming an extension implant region self-aligned to the gate electrode prior to forming the extension spacer structures.

14. The method of claim 7, wherein the step of forming the extension spacer structures comprises the steps of:
depositing a dielectric film over the substrate and gate electrode; and
anisotropically etching the dielectric film.

15. The method of claim 7, wherein the step of forming the first and second extension spacer structures comprises the steps of:
disposing a first dielectric film over the gate electrode;
selectively etching the first dielectric film to remove a portion thereof adjacent to the first side of the gate electrode, thus defining a first region in which the first dielectric film has been removed;
disposing a second dielectric film within the first region; and
etching the first and second dielectric films to define the first and second extension spacer structures.

16. The method of claim 7, wherein the step of forming the first and second extension spacer structures comprises the steps of:
disposing a first dielectric film over the gate electrode;
disposing a mask over the first dielectric film, thereby defining a masked region and an unmasked region, the unmasked region including a portion of the first dielectric film adjacent to the first side of the gate electrode;
removing the first dielectric film from the unmasked region;
forming a second dielectric film within the unmasked region;
stripping the mask; and
etching the first and second dielectric films to define the first and second extension spacer structures.

17. The method of claim 7, wherein the step of forming the first and second extension spacer structures comprises the steps of:
disposing a first dielectric film over the gate electrode;
removing a portion of the first dielectric film adjacent to the first side of the gate electrode while leaving a portion of the first dielectric film adjacent to the second side of the gate electrode;
disposing a second dielectric film adjacent to the first side of the gate electrode; and
etching the second dielectric film to define the second extension spacer structure.

18. The method of claim 17, wherein the step of removing a portion of the first dielectric film adjacent to the first side of the gate electrode while leaving a portion of the first dielectric film adjacent to the second side of the gate electrode defines the first extension spacer structure.

* * * * *